United States Patent [19]

Burum et al.

[11] Patent Number: 5,117,186
[45] Date of Patent: May 26, 1992

[54] METHOD FOR INCREASING RESOLUTION IN TWO-DIMENSIONAL SOLID-STATE NMR HETERONUCLEAR CORRELATION SPECTRA

[75] Inventors: Douglas P. Burum, Acton; Anthony Bielecki, Somerville, both of Mass.

[73] Assignee: Bruker Instruments, Inc., Billerica, Mass.

[21] Appl. No.: 598,142

[22] Filed: Oct. 16, 1990

[51] Int. Cl.$^5$ ............................................. G01R 33/20
[52] U.S. Cl. ..................................... 324/307; 324/300
[58] Field of Search ............... 324/300, 307, 308, 309, 324/310, 311, 312, 313, 314; 128/653 R, 653 A

[56] References Cited

U.S. PATENT DOCUMENTS

| | | |
|---|---|---|
| 3,530,374 | 9/1970 | Haeberlen et al. |
| 3,781,650 | 12/1973 | Keller |
| 4,168,462 | 9/1979 | Ernst ................................. 324/313 |
| 4,443,761 | 4/1984 | Levitt |
| 4,470,014 | 9/1984 | Levitt et al. |
| 4,486,709 | 12/1984 | Bendall |
| 4,510,449 | 4/1985 | Ernst et al. |
| 4,521,732 | 6/1985 | Pegg et al. |
| 4,682,107 | 7/1987 | Bendall et al. |
| 4,959,612 | 9/1990 | Luyten ............................. 324/311 |

OTHER PUBLICATIONS

Frequency-Switched Pulse Sequences: Homonuclear Decoupling and Dilute Spin NMR in Solids, Bielecki et al.
Heteronuclear Correlation Spectroscopy in Rotating Solids, Caravatti et al.
Heteronuclear Solid-State Correlation Spectroscopy, Caravatti et al.
Two-Dimensional Heteronuclear Chemical Shift Correlation Spectroscopy in Rotating Solids, Roberts et al.
Low-Power Multipulse Line Narrowing in Solid-State NMR, Burum et al.
Two-Dimensional Fourier Spectroscopy, pp. 285-286, Basic Principles.

Primary Examiner—Michael J. Tokar
Attorney, Agent, or Firm—Wolf, Greenfield & Sacks

[57] ABSTRACT

A new RF pulse sequence is applied to selected nuclei in the evolution period of a 2D NMR heteronuclear correlation experiment to more effectively suppress heteronuclear interactions. The new pulse sequence is designed to be effective with the existing BLEW-12 pulse sequence so that both homonuclear and heteronuclear interactions are suppressed. In addition, the new pulse sequence effectively suppresses homonuclear interactions so that it can be used with a variety of nuclear species.

26 Claims, 5 Drawing Sheets

METHOD FOR INCREASING RESOLUTION IN TWO-DIMENSIONAL SOLID-STATE NMR HETERONUCLEAR CORRELATION SPECTRA

FIELD OF THE INVENTION

This invention relates to two-dimensional solid state NMR spectroscopy and, in particular, to radio-frequency pulse sequences for improving the resolution of two-dimensional heteronuclear correlation spectra by suppressing heteronuclear dipolar interactions.

BACKGROUND OF THE INVENTION

Nuclear magnetic resonance (NMR) is a phenomenon exhibited by a select group of atomic nuclei and is based upon the existence of nuclear magnetic moments in these nuclei (termed "gyromagnetic" nuclei). When a gyromagnetic nucleus is placed in a strong, uniform and steady magnetic field (a so called "Zeeman field") an perturbed by means of a weak radio frequency (RF) magnetic field, it precesses at a natural resonance frequency known as a Larmor frequency, which is characteristic of each nuclear type and is dependent on the applied field strength in the location of the nucleus. Typical gyromagnetic nuclei include $^1H$ (protons), $^{13}C$, $^{19}F$ and $^{31}P$. The resonant frequencies of the nuclei can be observed by monitoring the transverse magnetization which results after a strong RF pulse. It is common practice to convert the measured signal to a frequency spectrum by means of Fourier transformation.

Although identical nuclei have the same frequency dependence upon the magnetic field, differences in the chemical environment of each nucleus can modify the applied magnetic field in the local vicinity of the nucleus, so that nuclei in the same sample do not experience the same net magnetic field. The differences in the local magnetic field result in spectral shifts in the Larmor frequencies between two such chemically non-equivalent nuclei, called "chemical shifts". These chemical shifts are interesting in that they reveal information regarding the number and placement of the atoms in a molecule and in the positioning of adjacent molecules with respect to each other in a compound.

Unfortunately, it is not always possible to interpret the frequency spectra produced by the chemical shifts because of other interfering and dominant interactions. This is particularly true in NMR spectroscopy of solids. In liquid NMR spectroscopy, the rapid motion of the liquid molecules tends to isolate the nuclei and separate the nuclear interactions, so that it is easier to distinguish separate nuclei in the final output. In solid state NMR, there are many interactions between the molecules which obscure the output. For example, the magnetic moments in neighboring nuclei perturb each other, resulting in interactions called dipole-dipole couplings. These couplings tend to broaden the characteristic resonance peaks and obscure the "fine" resonant structure produced by the chemical shifts. An additional problem found in solids, which is not present in liquids, is that the orientation of the solid molecules is relatively fixed with respect to the applied Zeeman field and, accordingly, the chemical shifts are anisotropic, in that a component of the resonant frequency depends on the physical orientation of the molecules with respect to the applied field.

Therefore, it is essential to suppress some interactions over others to obtain a meaningful output. This is usually done by perturbing the system at selected frequencies to cause unwanted interactions to cancel or average to a reduced amplitude. For example, in solids, the aforementioned chemical shift anisotropy is usually greatly reduced by orienting the solid sample at a "magic angle" (54′44″) with respect to the applied Zeeman field and physically rotating the solid at a relatively rapid rate causing the anisotropic field components to average to zero.

Similarly, by well-known techniques, it is possible to reduce the unwanted spin-spin interactions by irradiating the nuclei with additional pulses of RF energy at or near the Larmor frequencies. By properly selecting various orientations and phases of the RF pulses, the polarization of the perturbing nuclear spin systems in neighboring groups can be changed, effectively averaging out the spin interactions so that the contribution to the final output is greatly diminished. Since the Larmor frequencies for each nuclear type are distinct, an applied RF frequency will have a much greater effect on those nuclei which have a Larmor frequency which is close to the applied frequency than those nuclei in which the Larmor frequency is considerably different. Thus, the applied RF fields can be used to affect one type of nucleus while leaving others unchanged.

Due to the special problems encountered in solids, it is common to use a two-dimensional time domain spectroscopic technique to obtain increased resolution. With this technique it is possible to study the interaction or "correlation" between two different types of gyromagnetic nuclei in a solid—the interaction between protons and $^{13}C$ nuclei is typically of interest in many organic solids. The basic techniques of two-dimensional heteronuclear correlation as applied to solids are well-known and described in many articles, such as "Heteronuclear Solid State Correlation Spectroscopy", P. Caravatti, G. Bodenhausen and R. R. Ernst, *Chemical Physics Letters*, Vol. 89, No. 5, pp. 363-367 (July 1982) and "Heteronuclear Correlation Spectroscopy In Rotating Solids", P. Caravatti, L. Braunschweiler and R. R. Ernst, *Chemical Physics Letters*, Vol. 100, No. 4, pp 305-310 (September 1983) which articles are hereby incorporated by reference.

As described in the aforementioned articles, the basic two-dimensional heteronuclear correlation technique involves performing a process or "experiment" in the time domain, consisting of four distinct, sequential time intervals. The first time period is called is a "preparation" period. During this period, one of the two nuclei types to be studied is placed in a excited, coherent non-equilibrium state, which state will change or "evolve" in the subsequent time periods. The preparation time period may consist of the application of a single RF pulse to the system, or a sequence of RF pulses. The preparation period normally has a fixed time duration.

The second time period is called an "evolution" period during the course of which the excited nuclei evolve under the influence of the applied magnetic field, neighboring nuclei, any applied periodic RF pulse sequences and physical sample spinning. The evolution of the excited nuclei during this period allows these frequencies to be determined. A series of "experiments" or "scans" are carried out with a systematic incrementation of the evolution time period between each experiment.

The evolution period is followed by a "mixing" period. During the mixing period one or more RF pulses may be applied, which cause the transfer of coherence or polarization from the excited nuclei to the other nuclear type under observation. The transfer of coherence or polarization induced by the mixing process is characteristic of the nuclear system under investigation.

The mixing period is followed by a "detection" period in which the resonance frequencies of the second nuclear type are is measured. During this period it is conventional to apply further pulses or continuous wave RF energy to prevent further interaction of the two nuclear types.

After Fourier transformation, the result of the multiple experiments is a two-dimensional spectral "plot" called a heteronuclear correlation spectrum (also called a 2D HETCOR plot). One axis of this plot is the detected frequencies of the second nuclear species. The other axis represents the frequencies of the first nuclear species as determined from repeated scans or experiments with incremented evolution times. Since the output frequencies of the second nuclear species are dependent on the transfer of energy from the initially-excited first nuclear species and the state of the first nuclear species depends, in turn, on the evolution time, the second plot axis effectively represents the chemical shifts due to the various first nuclear species in a particular molecule and their spatial relation to the second species. Thus output peaks on the plot represent correlations between the first and second nuclear species of selected nuclei in a given molecule. One advantage of heteronuclear correlation is that it separates the proton resonance over the much larger $^{13}C$ chemical shift range. Therefore, the technique can provide well resolved proton chemical shift information for samples where it is impossible to resolve the proton chemical shifts with any standard, one-dimensional spectroscopic technique.

For example, in a typical two-dimensional heteronuclear correlation experiment applied to an organic material, it is common to study the correlation between the hydrogen, $^1H$ nuclei (protons), and $^{13}C$ nuclei within the sample. In order to do this, during the preparation period, an RF pulse is applied which excites the hydrogen protons. In theory, the protons would then freely evolve during the evolution period. During the mixing period, the protons interact with the $^{13}C$ nuclei through direct heteronuclear dipole-dipole coupling. Finally, during the detection period, the $^{13}C$ frequencies are detected. One of the advantages of such an experiment is that the heteronuclear coupling between the protons and $^{13}C$ nuclei depends entirely on the distance between the nuclei, regardless of chemical bonding. Thus, the correlation provides a method for studying the stereochemistry of individual molecules and the positioning of adjacent molecules relative to each other.

The problem with this technique is that other couplings, such as a "homonuclear" dipole-dipole coupling between protons and the "heteronuclear" dipole-dipole coupling between protons and carbon nuclei can obscure the desired output if these interactions are allowed to occur during the evolution time period because they affect the measurement of the proton chemical shifts. These latter two interactions cause spreading of the proton chemical shift peaks which results of overlap of separate proton sites, in turn, obscuring the various separate sites. Thus, it is necessary to suppress these two very strong interactions during the evolution time period. In certain circumstances, where a more abundant element is being observed instead of $^{13}C$, for example, phosphorous or aluminum, it may also be necessary to suppress the homonuclear interaction between these latter nuclei.

In general, in order to accomplish the suppression of homonuclear and heteronuclear couplings during the evolution period, carefully designed pulse sequences of RF pulses are applied to either the protons, the $^{13}C$ nuclei or both simultaneously during the evolution period. The purpose of these pulse sequences is to suppress or average the results of the unwanted interactions. Many RF pulse sequences of this type are well known in the prior art.

For example, in the prior art, RF pulse sequences were known which were relatively efficient for suppressing homonuclear interactions between the protons. In addition, other pulse sequences were known for suppressing heteronuclear interactions between the protons and the $^{13}C$ nuclei. In an attempt to simultaneously suppress both homonuclear and heteronuclear interactions, the prior art simply combined the known RF pulse sequences. Since the existing RF pulse sequences were never intended to be used in combination, the result was that a very long sequence of RF pulses was required to suppress both types of interactions, and the method did not work very well. Consequently, the number of inequivalent proton sites that could be resolved was severely limited, in turn, limiting the number of possible compounds that could be effectively studied.

Accordingly, it is an object of the present invention to improve resolution of a conventional two-dimensional NMR correlation experiment.

It is another object of the present invention to increase the number of proton sites which can be resolved in a conventional two-dimensional NMR correlation experiment.

It is still another object of the present invention to provide a new RF pulse sequence which improves resolution of a conventional two-dimensional NMR correlation experiment.

It is yet another object of the present invention to provide a new RF pulse sequence for use during the evolution period of a two-dimensional NMR correlation experiment, which pulse sequence can effectively suppress heteronuclear dipolar coupling.

It is a further object of the present invention to provide new RF pulse sequences, which can be used in conjunction with other pulse sequences during the evolution period of a two-dimensional NMR correlation experiment to effectively suppress homonuclear and heteronuclear interactions.

SUMMARY OF THE INVENTION

The foregoing problems are solved and the foregoing objects are achieved in illustrative embodiment of the invention, in which a new RF pulse sequence is applied to selected nuclei in the evolution period of a 2D NMR heteronuclear correlation experiment to more effectively suppress heteronuclear interactions. The new pulse sequence is designed to be effective with an existing pulse sequence so that both homonuclear and heteronuclear interactions are suppressed. In addition, the new pulse sequence effectively suppresses homonuclear interactions so that it can be used with a variety of nuclear species.

For example, in a $^1H$—$^{13}C$ system, a prior art RF pulse sequence is applied to the protons during the evolution period. The inventive RF pulse sequence is applied to the $^{13}C$ nuclei. The result is that the protons and $^{13}C$ nuclei are effectively totally decoupled so that the protons can evolve freely in the evolution period. Then further known pulse sequences are applied during the mixing period to obtain good heteronuclear coupling resulting in a high resolution output. The inventive pulse sequence also decouples the $^{13}C$ nuclei and thus is effective for other nuclei such as phosphorus or aluminum.

DETAILED DESCRIPTION OF THE PREFERRED EMBODIMENTS

Figure 1:
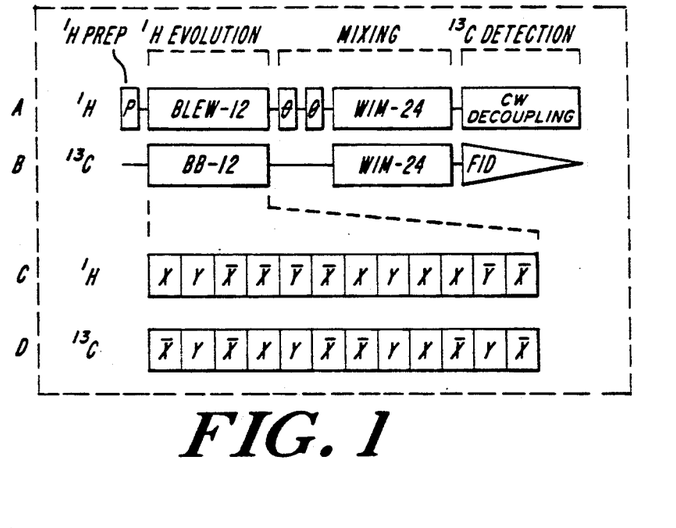
FIG. 1 is a schematic block diagram of a 2D NMR heteronuclear correlation experiment using an embodiment of the inventive RF pulse sequence.

The complete experiment conducted in accordance with the invention is diagrammatically illustrated in FIG. 1. As illustrated, FIG. 1 shows application to a proton-$^{13}C$ system, however, the particular RF pulse sequences are also applicable to other systems such as proton phosphorus or proton-aluminum systems. The experiment has the aforementioned four part structure consisting of sequential time periods of preparation, evolution, mixing and detection. Line A of the diagram represents an RF pulse sequence applied at the proton resonant frequency and line B represents an RF pulse sequence applied at the $^{13}C$ resonant frequency.

Lines C and D of FIG. 1 represent, in more detail, the RF pulse sequences applied during the evolution period to the protons and $^{13}C$ nuclei, respectively. Each box in the sequence which is designated with an X or Y marking comprises a single RF pulse applied to the system. By convention, the applied fields are referenced to a Cartesian coordinate system with the applied Zeeman field pointing along the Z axis. Accordingly, the applied RF fields are polarized 90° to the Zeeman field or along the X and Y axes. Since the X and Y axes are arbitrary directional designations, the pulse designations of X and Y are taken to represent relative phases of the signals. For example a RF pulse designated as an X pulse has a relative phase shift of 90° with respect to an RF pulse designated as a Y pulse. Similarly, an RF pulse designated as $\overline{X}$ or $-X$ has a relative phase shift of 180° with respect to an X pulse.

In the illustrative experiment, the preparation period consists of a single proton $\pi/2$ pulse; no pulses are applied to the $^{13}C$ nuclei.

The evolution period of the protons occurs next and is the most critical part of the experiment. In order to obtain a useful heteronuclear correlation spectrum of a typical solid, it is necessary to effectively suppress both the $^1H$—$^1H$ homonuclear dipolar interaction and the $^1H$—$^{13}C$ heteronuclear dipolar interaction during the evolution period. If both of these interactions are not efficiently suppressed, the proton resolution and selectivity will be lost. Consequently, during this period both homonuclear and heteronuclear dipolar decoupling RF pulse sequences are applied while the protons evolve. The particular RF pulse sequence which is applied to the protons is designated as a BLEW-12 sequence which is shown in line C of FIG. 1. It consists of the sequential twelve pulse sequence:

X, Y, −X, −X, −Y, −X, X, Y, X, X, −Y, −X

The pulses are essentially 100 percent duty cycle, "windowless" pulses. The BLEW-12 pulse sequence is a well-known pulse sequence which causes efficient homonuclear decoupling between the protons. The BLEW-12 sequence and its operation is described in more detail in "*Low Power Multipulse Line Narrowing in Solid-State NMR*", D. P. Burum, M. Linder and R. R. Ernst, Journal of Magnetic Resonance, Vol 44, (1981) which article is hereby incorporated by reference.

In accordance with the invention, a new pulse sequence, designated as the BB-12 sequence is applied to the $^{13}C$ nuclei simultaneously with the BLEW-12 pulses as shown in line D of FIG. 1. The BB-12 sequence has been specially designed to operate efficiently with the existing BLEW-12 sequence and consists of the following twelve pulse sequence:

−X, Y, −X, X, Y, −X, −X, Y, X, −X, Y, −X

This new sequence has the effect of decoupling the proton-$^{13}C$ interaction as well as decoupling the $^{13}C$—$^{13}C$ interaction much more efficiently than known sequences. Both the BLEW-12 and BB-12 sequences may be repeated in their entirety during the evolution period as necessary. With both the homonuclear and heteronuclear interactions decoupled, the protons can freely evolve under the influence of the their chemical shift thereby producing superior resolution as will hereinafter be described.

After the evolution period, two separate pulses ($\theta$ and $\phi$ pulses) are applied to the protons to shift the magnetization developed in the evolution period into the transverse magnetic plane for later observation. The $\theta$ pulse is a 90° pulse and the $\phi$ is 63°($-Y$). The $\theta$ and $\phi$ pulses are followed by a special isotropic mixing pulse sequence (called the "windowless isotropic mixing" sequence, WIM-24) which is applied to transfer polarization selectively from the protons to directly-coupled the carbon nuclei via the direct heteronuclear dipolar interaction. The WIM-24 sequence also has the property that it suppresses the proton and $^{13}$C chemical shifts and the proton-proton and $^{13}$C—$^{13}$C homonuclear couplings, but retains the proton—$^{13}$C heteronuclear coupling. The WIM-24 sequence consists of a twenty four pulse sequence applied to the protons and a corresponding twenty-four pulse sequence simultaneously applied to the $^{13}$C nuclei. The sequence is well-known and is described in detail in the aforementioned article, "Heteronuclear Correlation Spectroscopy In Rotating Solids", P. Caravatti, L. Braunschweiler and R. R. Ernst, *Chemical Physics Letters*, Vol. 100, No. 4, pp 305–310 (September 1983).

In addition to the WIM-24 pulse sequence, other prior art sequences exist for achieving selective cross polarization during the mixing period, while continuing to suppress the homonuclear dipolar coupling. For example, although the WIM-24 sequence was preferred in terms of effectiveness and ease of implementation, phase and frequency switched Lee Goldberg irradiation, in combination with simultaneous, phase-switched $^{13}$C irradiation, would also produce an equally selective cross polarization during the mixing period. This mixing method is described in detail in "*Frequency Switched Pulse Sequences: Homonuclear Decoupling and Dilute Spin NMR in Solids*", A. Bielecki, A. C. Kolbert and M. H. Levitt, Chemical Physical Letters, Vol. 155, Nos. 4, 5, pp. 341 (1989) which article is hereby incorporated by reference. In some cases, it is possible that cross polarization via frequency switched Lee-Goldberg irradiation may prove to be superior to the WIM-24 sequence. An example of such a case is $^{19}$F/$^{13}$C cross polarization, where the abundant nucleus has a large chemical shift range.

Finally, during the detection period, a relatively high-power continuous-wave signal at the proton resonance frequency is applied to the protons to decouple them from the $^{13}$C nuclei in a well-known manner. The $^{13}$C FID is acquired during this period in a conventional manner. Also, in accordance with standard practice, during the entire experiment, the solid sample is physically rotated about the magic angle in order to suppress broadening due to chemical shift anisotropy as previously mentioned.

Figure 6A:
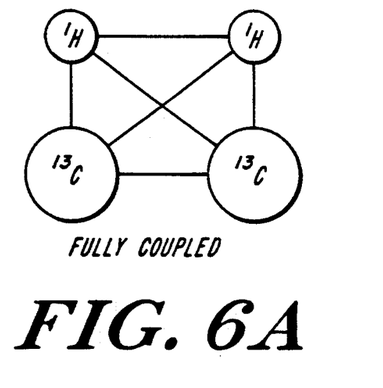
FIG. 6A is a schematic diagram representing the homonuclear and heteronuclear couplings in the preparation time period of the 2D NMR heteronuclear correlation experiment outlined in FIG. 1.
Figure 6B:
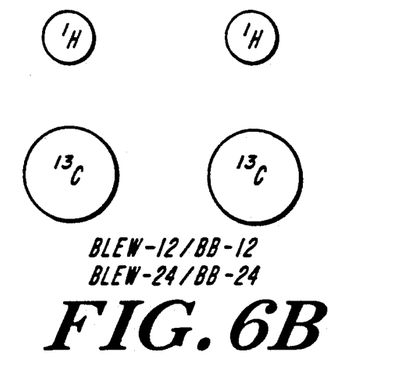
FIG. 6B is a schematic diagram representing the homonuclear and heteronuclear couplings in the evolution time period of the 2D NMR heteronuclear correlation experiment outlined in FIG. 1.
Figure 6C:
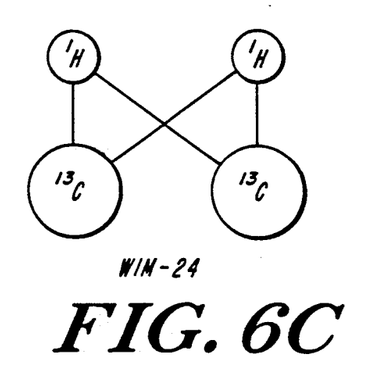
FIG. 6C is a schematic diagram representing the homonuclear and heteronuclear couplings in the mixing time period of the 2D NMR heteronuclear correlation experiment outlined in FIG. 1.

The various couplings between the nuclei in a proton-carbon system are schematically represented in FIGS. 6A–6C. More particularly, FIG. 6A represents the natural nuclear dipole-dipole couplings in a proton-carbon system. Although only two nuclei of each type are illustrated it is to be understood that these represent schematically couplings between many pairs of nuclei in a typical molecule. Homonuclear $^1$H—$^1$H and $^{13}$C—$^{13}$C couplings are shown as well as heteronuclear $^1$H—$^{13}$C couplings.

As shown in FIG. 6B, during the evolution period, under influence of the BLEW-12/BB-12 pulse sequences, both the homonuclear $^1$H—$^1$H and $^{13}$C—$^{13}$C couplings as well as the heteronuclear $^1$H—$^{13}$C couplings are effectively suppressed, thereby allowing the protons to evolve under influence of the chemical shifts in accordance with the invention.

In FIG. 6C, the known effect of the WIM-24 pulse sequence is to suppress the homonuclear $^1$H—$^1$H and $^{13}$C—$^{13}$C couplings while retaining the heteronuclear $^1$H—$^{13}$C couplings thereby efficiently transferring the magnetization from the $^1$H nuclei to the $^{13}$C nuclei.

Figure 6D:
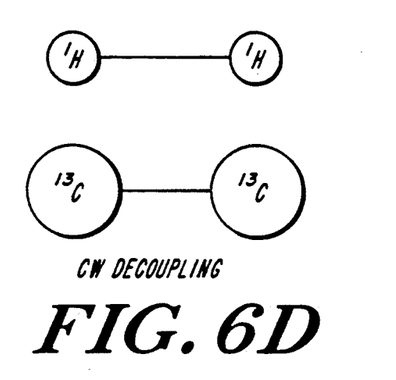
FIG. 6D is a schematic diagram representing the homonuclear and heteronuclear couplings in the detection time period of the 2D NMR heteronuclear correlation experiment outlined in FIG. 1.

Finally, during the detection period as shown in FIG. 6D, the heteronuclear $^1$H—$^{13}$C couplings are suppressed by CW decoupling irradiation while the homonuclear $^1$H—$^1$H and $^{13}$C—$^{13}$C couplings remain.

Mathematical Theory

In order to understand the effectiveness of the BLEW-12/BB-12 pulse sequence combination in suppressing the heteronuclear dipolar interaction during the evolution period, it is useful to consider the effect of a single, simultaneous $^1$H/$^{13}$C $\pi$-pulse, with RF phase applied along the Y axis to both the $^1$H and $^{13}$C nuclei. For mathematical simplicity, the following mathematical expressions are referenced to a coordinate system which rotates around the Z-axis at the proton resonance frequency in the same sense as the natural precession. This coordinate system is referred to as the "rotating frame". The evolution of the protons during the evolution period can be mathematically described by a time varying mathematical expression in the rotating frame which is dependent on physical quantities and is known as a "Hamiltonian" operator. This expression and its derivation are well-known to those skilled in the art.

The secular part of the Hamiltonian operator which expresses the heteronuclear dipolar interaction can be expressed as:

$$H_D^{(z)} = \sum_{i,j} A_{ij} I_{iz} S_{jz} \tag{1}$$

Where $I_{iz}$ and $S_{jz}$ are the spin operators corresponding to the proton i and the carbon j, and $A_{ij}$ is a constant describing the coupling strength between them. During the simultaneous pulse mentioned above, the Hamiltonian in the toggling frame becomes time dependent, and can be expressed as:

$$\tilde{H}_D^{(z)}(t) = H_D^{(z)} \cos^2\Omega + H_D^{(x)} \sin^2\Omega + H_D^{(zx)} \sin 2\Omega \tag{2}$$

where $\Omega$ varies from zero to 90° during the pulse. Here $H_D^{(x)}$ has the same form as $H_D^{(z)}$, but with the operators $I_z$ and $S_z$ replaced with $I_x$ and $S_x$. The cross term $H_D^{(zx)}$ may be written:

$$H_D^{(zx)} = \sum_{i,j} 1/2 \, A_{ij}(I_z S_x + I_x S_z) \tag{3}$$

By simple integration, the zero-order average hereronuclear dipolar Hamiltonian for this individual, simultaneous pulse is then given by:

$$\bar{H}_D^{(0)} = 1/2 H_D^{(z)} + 1/2 H_D^{(x)} + 2/\pi \, H_D^{(zx)} \tag{4}$$

The BLEW-12/BB-12 pulse sequence is entirely composed of simultaneous pulses of this type. Therefore, the zero order average Hamiltonian for the sequence as a whole is simply a sum of terms of the form given in equation (4). If the terms are listed in order, one finds that the "pure" terms cancel for each 6-pulse group, and the "mixed" terms cancel over the cycle as a whole.

The "average" Hamiltonian which is obtained by simple integration of the time varying Hamiltonian during the pulse sequence may be used to predict the time evolution of the spin system only to the extent that the pulse sequence is short compared to the magnitude of the Hamiltonian. In other words, if the average Hamiltonian for the sequence is zero, it is approximately true that the interaction has been averaged to zero, and this approximation becomes better as the pulse sequence becomes shorter. The improved performance of this invention in comparison to the prior art is due to the fact that the new pulse sequences introduced cause the unwanted Hamiltonian terms to average to zero over much shorter time intervals.

Experimental Results

The inventive method requires an NMR spectrometer which can perform heteronuclear Fourier transform NMR. The system must provide for double resonance with magic angle spinning. Quadrature phase control on both channels is required, with the capability to produce contiguous 90° RF pulses in long sequences. The system must also be able to produce bursts of RF power lasting 50 milliseconds or more on both channels without undue heating or dielectric breakdown. The pulse timing unit must be fast enough, and have sufficient memory, to produce the sequence required. The RF amplifiers must have a droop factor over long bursts of approximately 3% or less. The accuracy of the RF adjustment should be better than 0.1% for the amplitude and 0.1° for the phase. The computer and software must be capable of acquiring and analyzing 2D NMR data sets with sizes of 256 kwords or more. In a preferred system, the 90° pulse width would be 4 microseconds or less and the sample spinning rate would be about 4 kHz.

The inventive method was implemented on a Bruker MSL-300 NMR spectrometer manufactured by Bruker Instruments, Billerica, Mass., using a standard Bruker CPMAS probe, which system met the above requirements. The RF modulator design of the MSL-300 system, which provides four parallel RF channels with quadrature phase, allowed the aforementioned simultaneously-applied windowless pulse sequences to be generated without any need to compensate for the switching delays found in single channel, phase-switched designs.

In addition to the basic experiment shown in FIG. 1, the RF pulses were phase cycled in accordance with conventional NMR spectroscopic techniques to suppress potential artifacts in the receivers. The phase cycling scheme used to obtain all data is shown in Table I:

TABLE I

Phase Cycling During the Heteronuclear Correlation Experiment[a,b,c]

| Scan | 1 | 2 | 3 | 4 | 5 | 6 | 7 | 8 |
|---|---|---|---|---|---|---|---|---|
| $^1$H Prep Pulse | X | −X | X | −X | X | −X | X | −X |
| $^{13}$C WIM-24[d] | X | X | −Y | −Y | −X | −X | Y | Y |
| Receiver Phase | X | −X | −Y | Y | −X | X | Y | −Y |

Notes:
a. For all scans, the mixing pulses Θ = X, φ = 63°(−Y)
b. All pulses except φ are 90° pulses.
c. The overall $^1$H phase of the initial pulse P, the evolution period and the first mixing pulse Θ was incremented by 90° after each experiment in order to obtain phase sensitive spectra by the TPPI method.
d. $^{13}$C WIM-24 refers to the overall phase shift of the WIM-24 sequence applied to the $^{13}$C nuclei.

The 180° phase alternation of the initial $^1$H preparation pulse, P, is an implementation of the well-known "spin temperature alternation" method for eliminating pulse dead time effects. The cycling of the overall $^{13}$C WIM-24 phase was used to eliminate any quadrature images which might otherwise result from an improperly balanced receiver.

In order to obtain purely absorptive, phase-sensitive 2D spectra, the overall $^1$H phase of the first half of the experiment, including the first pulse, the entire evolution period and the first mixing pulse, was advanced by 90° after each experiment. This is the well known method of time proportional phase incrementation (TPPI) method described in "Principles of Nuclear Magnetic Resonance in One and Two Dimensions", pp 340–341, Clarendon Press, Oxford, 1987, which article is hereby incorporated by reference. In cases where it is desired to obtain only a magnitude spectrum, the phase incrementation and the second mixing pulse can be omitted.

The sample rotor spinning speed was set to approximately 4 kHz which was selected to be a good compromise between the need to suppress the $^{13}$C spinning sidebands and the requirement for the conventional "CRAMPS" technique that the rotor speed be slow compared to the pulse cycle time as described in "Heteronuclear Correlation Spectroscopy In Rotating Solids", P. Caravatti, L. Braunschweiler and R. R. Ernst, Chemical Physics Letters, Vol 100, No. 4, pp 305–310 (September 1983) and "Total Suppression of Sidebands in CPMAS C-13 NMR", W. T. Dixon, J. Schaefer, M. D. Sefcik, E. O. Stejskal and R. A. McKay, Journal of Magnetic Resonance, Vol. 49, No., (1982) which articles are hereby incorporated by reference.

Initial preparation for the experiment consisted mostly of the standard CPMAS and CRAMPS "tune-up" procedures. Painstakingly careful adjustment did not appear to be necessary, especially on the $^{13}$C channel. A preliminary spectrum could be acquired in most cases with a measurement time of a few hours, but the spectra discussed hereinafter were obtained in overnight or over-weekend acquisitions.

Figure 2A:
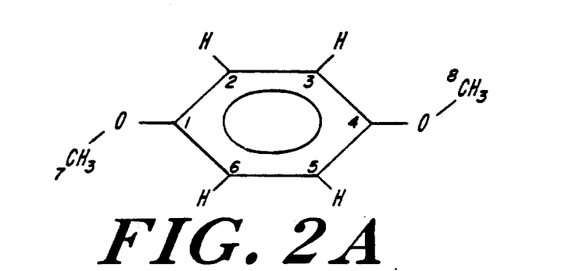
FIG. 2A is a diagrammatic representation of the molecular structure of para dimethoxy benzene.
Figure 2B:
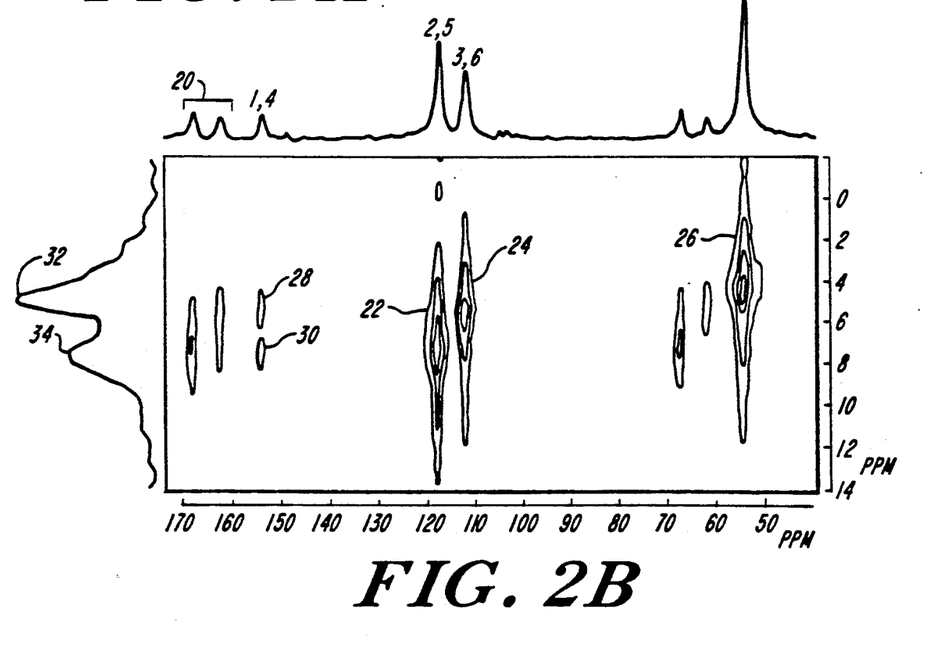
FIG. 2B is a 2D HETCOR of para-dimethoxy benzene obtained using the experiment outlined in FIG. 1.

FIG. 2A shows a conventional schematic representation of a molecule of the organic compound para-dimethoxy benzene with the carbon atoms separately numbered The corresponding 2D heteronuclear correlation spectrum of para-dimethoxy benzene produced with the inventive method is shown in FIG. 2B. In FIG. 2B, the horizontal scale represents the $^{13}$C chemical shifts (with the resonance peaks corresponding to each carbon nuclei numbered to correspond with the numbering scheme used in FIG. 3A) and the vertical scale represents the $^1$H chemical shifts. Since the absolute resonant frequency depends on the applied Zeeman field strength, the relative shifts are generally expressed in terms of parts per million (ppm) in accordance with conventional NMR practice. In this 2D HETCOR plot, the direct correlations are clearly resolved, and the long range coupling of the non-protonated carbon spins to their nearest proton neighbors are also visible.

In this 2D HETCOR plot, the direct correlations are clearly resolved, and the long range coupling of the non-protonated carbon spins to their nearest proton neighbors are also visible. In the plot, the "columns" correspond to carbon chemical shift values, and the "rows" to proton chemical shifts.

In total, there are five distinct $^{13}$C resonances visible as distinct columns in the HETCOR spectrum shown in FIG. 2B. The additional resonances marked with a square bracket 20 at the left-hand side of FIG. 2B are artifacts due to the relatively slow spinning of the sample during the experiment (similar artifacts are marked with brackets in FIGS. 3B, 4B and 5B). Due to the symmetry of the molecule as shown in FIG. 2A, carbons designated as 1, 2, 3 and 7, and their attached protons, are completely equivalent to carbons 4, 5, 6 and 8 and their associated protons. For this reason, then will be referred to as carbons 1/4, 2/5, 3/6 and 7/8. These carbon resonance peaks have been identified along the upper horizontal axis of FIG. 2B for ease in identification.

Four of the resonances in the spectrum correspond to directly-bonded carbon-proton pairs, namely carbons 2/5, 3/6 and 7/8 and their attached protons. These carbon-proton pairs produce resonance correlation areas 22, 24 and 26 as shown in FIG. 2B. There are two resonance areas, 28 and 30 in the column corresponding to carbons 1 and 4, however. This is because these carbons, which have no directly bonded protons, are weakly coupled to the protons attached to carbons 2/5 and 3/6. Since these protons have different chemical shifts, two resonance areas, 28 and 30, are observed in this column.

Note also that it is possible to observe three distinct proton chemical shift values in the 2D HETCOR spectrum, whereas the proton resonance spectrum shown along the left side of FIG. 2B illustrates clearly that only two resonance peaks, 32 and 34, can be observed in a directly-measured proton spectrum due to overlap of the resonance lines.

Figure 3A:
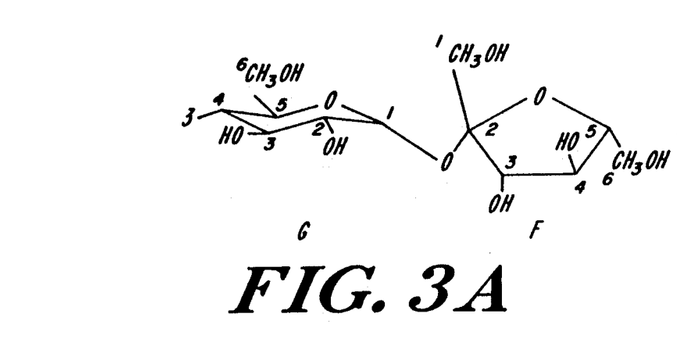
FIG. 3A is a diagrammatic representation of the molecular structure of sucrose.
Figure 3B:
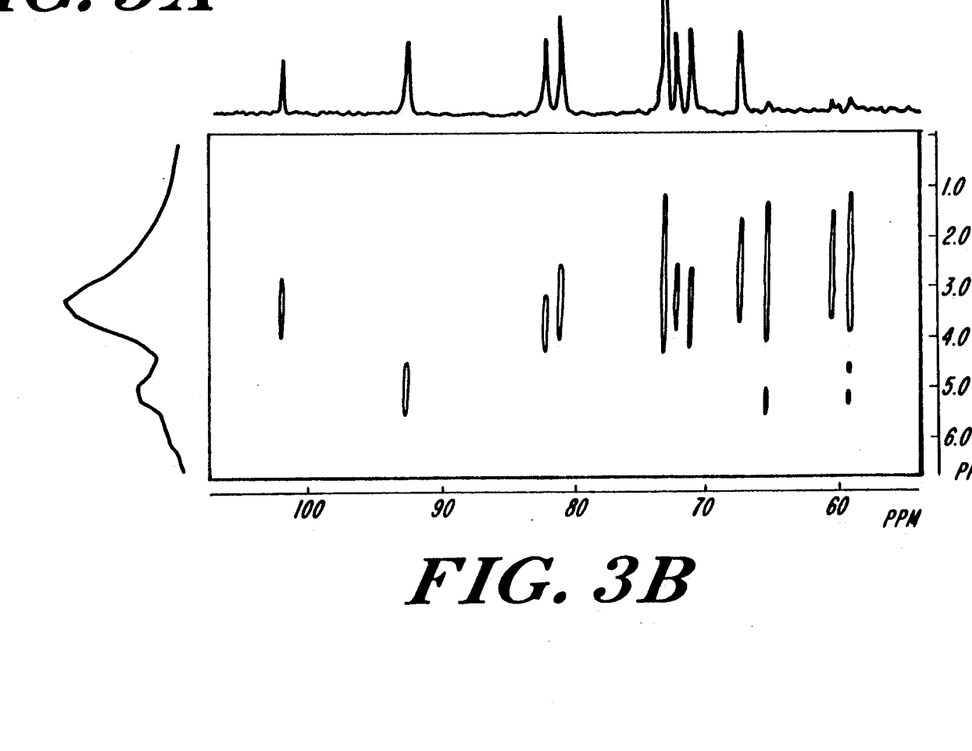
FIG. 3B is a 2D HETCOR of sucrose obtained using the experiment outlined in FIG. 1.

The result of applying the inventive technique to sucrose is shown in FIGS. 3A and 3B. FIG. 3A shows a conventional schematic representation of a molecule of sucrose with the carbon atoms separately numbered. The corresponding 2D heteronuclear correlation spectrum of sucrose produced with the inventive method is shown in FIG. 3B. In FIG. 3B, the columns containing the methylene $^{13}C$ chemical shifts have been enlarged to make them visible in the contour plot.

As can be seen in FIG. 3B, the correlations are totally unambiguous. Despite the very small proton chemical shift range in sucrose, the chemical shifts of each of the eight non-hydroxy protons are clearly resolved.

Figure 4A:
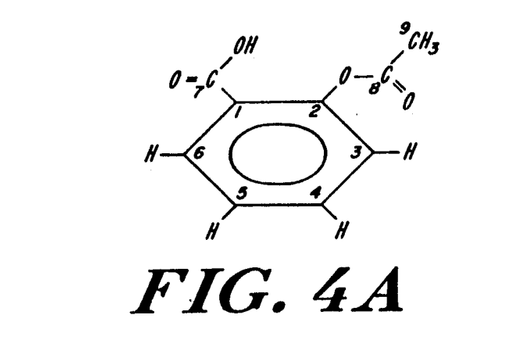
FIG. 4A is a diagrammatic representation of the molecular structure of aspirin.
Figure 4B:
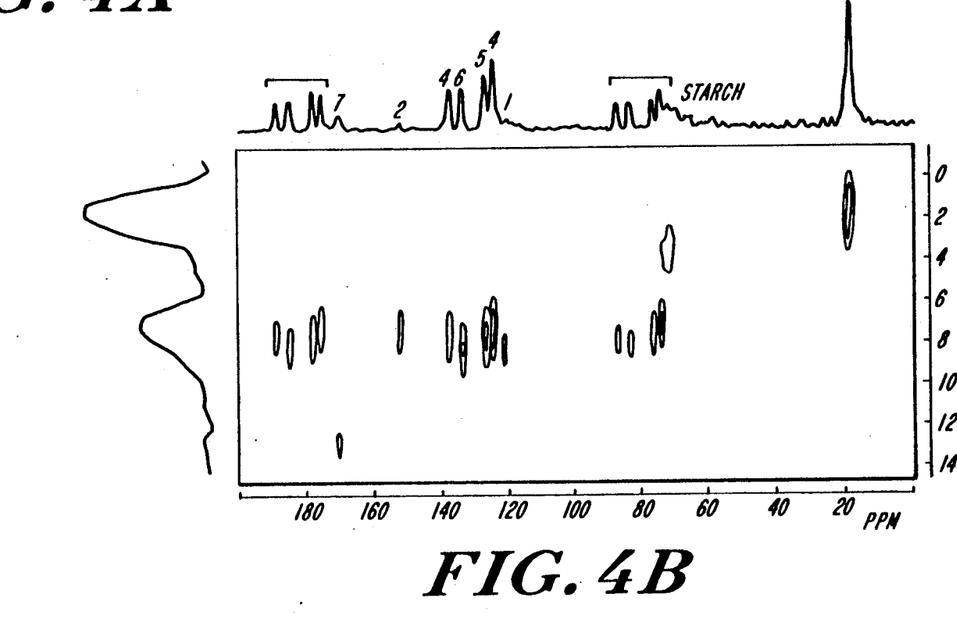
FIG. 4B is a 2D HETCOR of aspirin obtained using the experiment outlined in FIG. 1.

FIGS. 4A and 4B presents the results of a 2D heteronuclear measurement on aspirin. FIG. 4A shows a conventional schematic representation of a molecule of aspirin with the carbon atoms separately numbered. The corresponding 2D heteronuclear correlation spectrum of aspirin produced with the inventive method is shown in FIG. 4B. In FIG. 4B, several columns corresponding to non-protonated $^{13}C$ chemical shifts have been enlarged to make cross peaks due to long range $^{1}H/^{13}C$ couplings visible. As in the previous cases, both single bond and two-bond correlations are visible, and individual proton chemical shifts may be resolved even though these latter chemical shifts strongly overlap in a one-dimensional $^{1}H$ projection. The $^{13}C$ chemical shift assignments shown in FIG. 4B are taken from "Solid State $^{13}C$ NMR Study of Drugs: Aspirin", C. Chang, L. Diaz, F. Morin and D. Grant, *Magnetic Resonance in Chemistry*, Vol. 24, pp 768 (1986), and are fully consistent with the cross peak information shown in the 2D spectrum. In fact, there is enough information in this 2D spectrum to allow unambiguous assignment of nearly all of the $^{13}C$ lines.

Figure 5A:
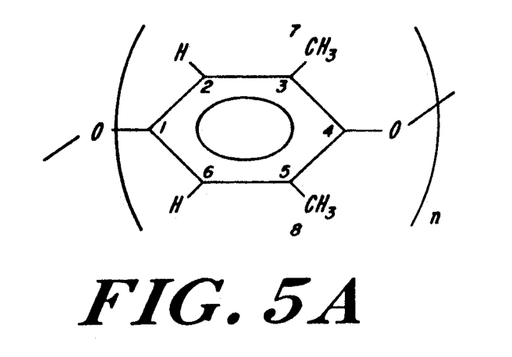
FIG. 5A is a diagrammatic representation of the molecular structure of poly(3,5-dimethyl phenylene oxide).
Figure 5B:
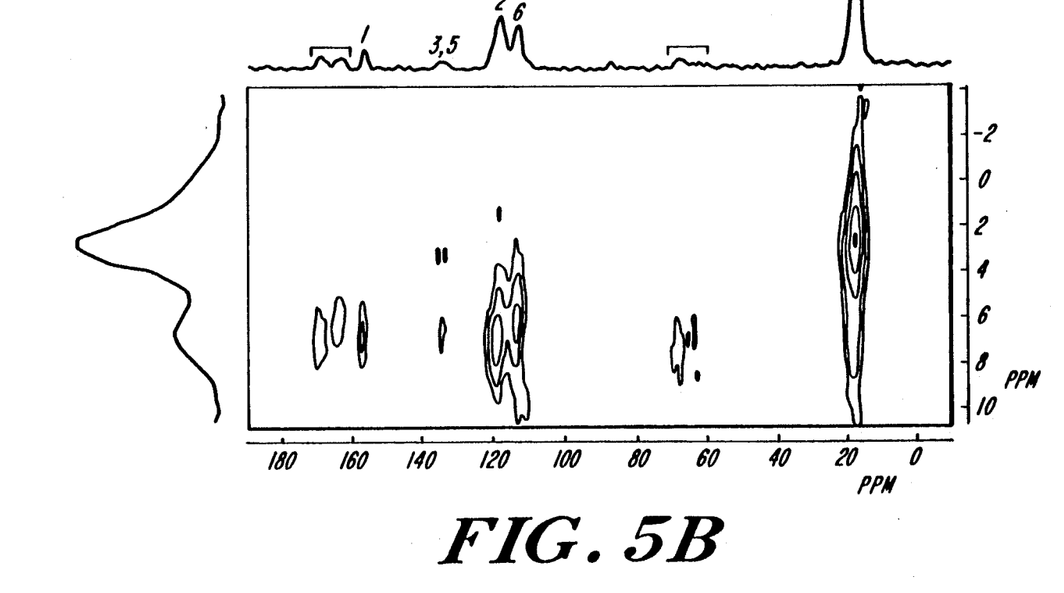
FIG. 5B is a 2D HETCOR of poly(3,5-dimethyl phenylene oxide) obtained using the experiment outlined in FIG. 1.

The structure and heteronuclear correlation spectrum of the polymer, poly (3,5-dimethyl phenylene oxide), is shown in FIGS. 5A and 5B, respectively. In this case, spinning sidebands due to the aromatic carbons are present. In cases where sidebands of this type generate a problem, a standard technique called TOSS described in "Total Suppression of Sidebands in CPMAS C-13 NMR", W. T. Dixon, J. Schaefer, M. D. Sefcik, E. O. Stejskal and R. A. McKay, Journal of Magnetic Resonance, Vol. 49, (1982) may be used to suppress them. Once again, in FIG. 5B, long range couplings between non-protonated carbon spins and their nearest neighbor protons are also visible.

Figure 7:
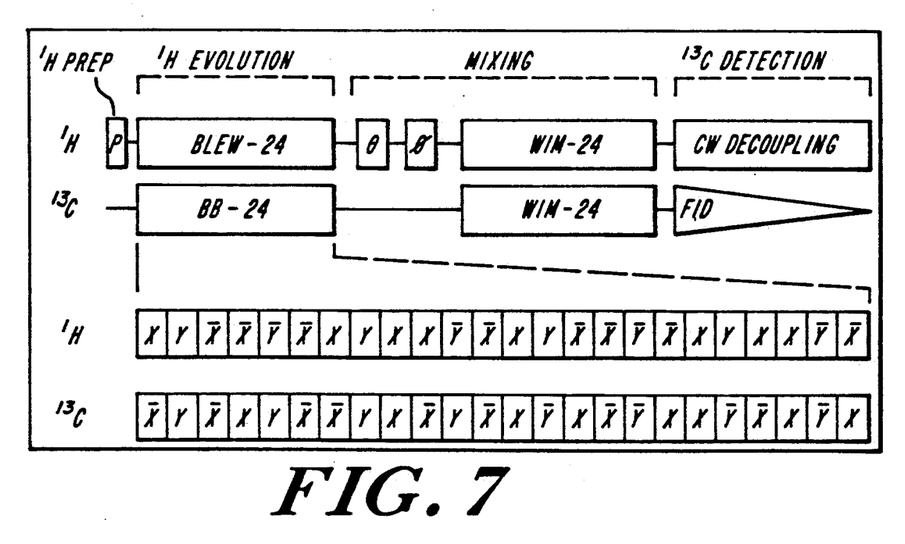
FIG. 7 is a schematic block diagram of a 2D NMR heteronuclear correlation experiment using an alternative embodiment of the inventive RF pulse sequence.

In addition to the BLEW-12/BB-12 pulse sequence described above, it is also possible to use an additional pulse sequence designated BLEW-24/BB-24 which provides even better heteronuclear decoupling than the BLEW-12/BB-12 pulse sequence. This pulse sequence is shown in FIG. 7 which is a schematic diagram similar to that shown in FIG. 1. The basic experimental sequence is identical to that disclosed in FIG. 1 with the exception that the pulse sequences applied to the $^{1}H$ and $^{13}C$ nuclei during the evolution period are as shown in FIG. 7, lines C and D, respectively. The BLEW-24 and BB-24 sequences each consist of a pulse sequence of twenty-four RF pulses applied to the respective nuclei.

The BLEW-24 and BB-24 sequences each consist of a pulse sequence of twenty-four RF pulses applied to the respective nuclei. The reason for the superior performance of BB-24 and BLEW-24 can be understood by expanding slightly on the description given in the mathematical section above. As explained in the description, the basic BB-12 and BLEW-12 sequences cause the average Hamiltonian to average to zero, which causes the system to behave somewhat as if the homonuclear and heteronuclear and interactions were gone, but this is only an approximation. A more exact treatment of the mathematics yields an infinite series of terms of diminishing magnitude which exactly describe the effective Hamiltonian during the pulse sequence. In this more exact description, BB-12 and BLEW-12 cause the first, so-called "zero'th order" term to cancel for the proton and carbon homonuclear couplings and for the heteronuclear coupling. However, the only first order term which cancels is for the proton homonuclear interaction. On the other hand, BB-24 and BLEW-24 cause all of the first order terms to cancel, along with the zero'th order terms. In addition, since BB-24 and BLEW-24 are composed of two BB-12 and BLEW-12 sequences placed end-to-end, the rate at which the zero'th order terms vanish is identical to BB-12 and BLEW-12. Therefore, BB-24 and BLEW-24 provide a more powerful solution than BB-12 and BLEW-12.

Although only two embodiments of the inventive method have been described, several modifications and changes will be immediately apparent to those skilled in the art. For example, the illustrated pulse sequences may be modified in obvious ways to generate new pulse sequences which will perform according to the inventive method. These obvious modifications include cyclic permutations, axis rotations and reflections. An example of a cyclic permutation is as follows. If the original pulse sequence is:

$$-X, Y, -X, X, Y, -X, -X, Y, X, -X, Y, -X \qquad (5)$$

then one cyclically permuted sequence can be created by moving one pulse from the end of the sequence to the beginning to create the new sequence:

$$-X, -X, Y, -X, X, Y, -X, -X, Y, X, -X, Y \qquad (6)$$

which is equivalent to the original sequence. Additional sequences can be created by repeating the cyclic process on the sequence (6). In this permutation and those that follow, the corresponding BLEW-12 sequence may also be permuted in a similar manner for use with this permuted BB-12 sequence or the permuted BB-12 sequence can be used with the original BLEW-12 sequence.

An example of an axis rotation can be created by replacing X by Y, −X by −Y, and Y by −X in sequence (5) to create the new sequence:

$$-Y, -X, -Y, Y, -X, -Y, -Y, -X, Y, -Y, -X, -Y \quad (7)$$

which operates in an equivalent manner to the original sequence.

Another example of an axis rotation can be created by replacing X by −X, and Y by −Y in sequence (5) to create the new sequence:

$$X, -Y, X, -X, -Y, X, X, -Y, -X, X, -Y, X \quad (8)$$

which operates in an equivalent manner to the original sequence.

An example of a reflection be created by replacing reversing the sequence order of sequence (5) to create the new sequence:

$$-X, Y, -X, X, Y, -X, -X, Y, X, -X, Y, -X \quad (9)$$

which is equivalent to the original sequence.

Another example of a reflection can be obtained by replacing X and Y in sequence (5) to create the new sequence:

$$-Y, X, -Y, Y, X, -Y, -Y, X, Y, -Y, X, -Y \quad (10)$$

These modifications and other obvious changes are intended to be covered by the following claims

What is claimed is:

1. In a solid-state, two-dimensional heteronuclear correlation NMR experiment involving a first nuclear species and a second nuclear species and having a preparation period, an evolution period, a mixing period and a detection period wherein said first nuclear species is excited with at least one radio frequency preparation pulse during said preparation period and is irradiated with a BLEW-12 radio frequency pulse sequence during said evolution period, a method for improving resolution comprising the steps of:

A. irradiating said second nuclear species during said evolution period with at least one radio frequency pulse sequence composed of twelve 90° radio-frequency pulses having the relative phases:

$$-X, Y, -X, X, Y, -X, -X, Y, X, -X, Y, -X,$$

where the phase of an X pulse differs from the phase of a Y pulse by 90° and the phase of an X pulse differs from the phase of a −X pulse by 180°.

2. In a solid-state, two-dimensional heteronuclear correlation NMR experiment, the method for improving resolution according to claim 1 further comprising the step of:

B. irradiating said first and said second nuclear species with a WIM-24 pulse sequence during said mixing period.

3. In a solid-state, two-dimensional heteronuclear correlation NMR experiment, the method for improving resolution according to claim 1 wherein step A further comprises the step of:

A1. irradiating said second nuclear species with at least one radio-frequency pulse sequence which is a cyclic permutation of the radio-frequency pulse sequence:

$$-X, Y, -X, X, Y, -X, -X, Y, X, -X, Y, -X.$$

4. In a solid-state, two-dimensional heteronuclear correlation NMR experiment, the method for improving resolution according to claim 1 wherein step A further comprises the step of:

A2. irradiating said second nuclear species with at least one radio-frequency pulse sequence which is a rotation of the radio frequency pulse sequence:

$$-X, Y, -X, X, Y, -X, -X, Y, X, -X, Y, -X.$$

5. In a solid-state, two-dimensional heteronuclear correlation NMR experiment, the method for improving resolution according to claim 1 wherein step A further comprises the step of:

A3. irradiating said second nuclear species with at least one radio-frequency pulse sequence which is a reflection of the radio-frequency pulse sequence:

$$-X, Y, -X, X, Y, -X, -X, Y, X, -X, Y, -X.$$

6. In a solid-state, two-dimensional heteronuclear correlation NMR experiment involving a first nuclear species and a second nuclear species and having a preparation period, an evolution period, a mixing period and a detection period wherein said first nuclear species is excited with a radio-frequency preparation pulse during said preparation period and is irradiated with a BLEW-24 radio-frequency pulse sequence during said evolution period, a method for improving resolution comprising the steps of:

A. irradiating said second nuclear species during said evolution period with at least one radio-frequency pulse sequence composed of twenty-four 90° radio-frequency pulses having the relative phases:

$$-X, Y, -X, X, Y, -X, -X, Y, X, -X, Y, -X, X,$$
$$-Y, X, -X, -Y, X, X, -Y, -X, X, -Y, X,$$

where the phase of an X pulse differs from the phase of a Y pulse by 90° and the phase of an X pulse differs from the phase of a −X pulse by 180°.

7. In a solid-state, two-dimensional heteronuclear correlation NMR experiment, the method for improving resolution according to claim 6 further comprising the step of:

B. irradiating said first and said second nuclear species with a WIM-24 pulse sequence during said mixing period.

8. In a solid-state, two-dimensional heteronuclear correlation NMR experiment, the method for improving resolution according to claim 6 wherein step A further comprises the step of:

A1. irradiating said second nuclear species with at least one radio-frequency pulse sequence which is a cyclic permutation of the radio-frequency pulse sequence:

−X, Y, −X, X, Y, −X, −X, Y, X, −X, Y, −X, X.
−Y, X, −X, −Y, X, X, −Y, −X, X, −Y, X.

9. In a solid-state, two-dimensional heteronuclear correlation NMR experiment, the method for improving resolution according to claim 6 wherein step A further comprises the step of:
   A2. irradiating said second nuclear species with at least one radio-frequency pulse sequence which is a rotation of the radio-frequency pulse sequence:

−X, Y, −X, X, Y, −X, −X, Y, X, −X, Y, −X, X,
   −Y, X, −X, −Y, X, X, −Y, −X, X, −Y, X.

10. In a solid-state, two-dimensional heteronuclear correlation NMR experiment, the method for improving resolution according to claim 6 wherein step A further comprises the step of:
    A3. irradiating said second nuclear species with at least one radio-frequency pulse sequence which is a reflection of the radio-frequency pulse sequence:

−X, Y, −X, X, Y, −X, −X, Y, X, −X, Y, −X, X,
    −Y, X, −X, −Y, X, X, −Y, −X, X, −Y, X.

11. A method for performing a solid-state, two-dimensional heteronuclear correlation NMR experiment involving a first nuclear species and a second nuclear species comprising the steps of:
    A. exciting said first nuclear species with at least one radio-frequency preparation pulse during a preparation period;
    B. irradiating said first nuclear species with a BLEW-12 radio-frequency pulse sequence during an evolution period subsequent to s id preparation period;
    C. irradiating said second nuclear species during said evolution period with at least one radio-frequency pulse sequence composed of twelve 90° radio-frequency pulses having the relative phases:

−X, Y, −X, X, Y, −X, −X, Y, X, −X, Y, −X, where the phase of an X pulse differs from the phase of a Y pulse by 90° and the phase of an X pulse differs from the phase of a −X pulse by 180°;
    D. irradiating said first and said second nuclear species during a mixing period subsequent to said evolution period with a radio-frequency pulse sequence which suppresses homonuclear coupling between nuclei of said first species and nuclei of said second species;
    E. irradiating said first nuclear species with continuous-wave radio-frequency energy during a detection period following said mixing period; an
    F. detecting the transverse magnetization of said second nuclear species during said detection period.

12. A method for performing a solid-state, two-dimensional heteronuclear correlation NMR experiment according to claim 11 wherein step D comprises the step of:
    D1. irradiating said first and said second nuclear species during said mixing period with a WIM-24 radio-frequency pulse sequence.

13. A method for performing a solid-state, two-dimensional heteronuclear correlation NMR experiment according to claim 11 wherein step D comprises the step of:
    D2. irradiating said first nuclear species during said mixing period with phase-switched and frequency-switched Lee-Goldberg radio-frequency signals; and
    D3. irradiating said second nuclear species during said mixing period with phase-switched radio-frequency signals simultaneously with step D2.

14. A method for performing a solid-state, two-dimensional heteronuclear correlation NMR experiment according to claim 11 wherein step A comprises the step of:
    A1. irradiating said first nuclear species with a single 90° radio-frequency pulse during said preparation period.

15. A method for performing a solid-state, two-dimensional heteronuclear correlation NMR experiment according to claim 11 wherein said evolution period has a predetermined duration and said method further comprising the steps of:
    G. incrementing said evolution period duration a predetermined amount;
    H. repeating steps A–F;
    I. repeating steps G and H a predetermined number of times to acquire a plurality of data points;
    J. performing a Fourier transformation in two dimensions on said data points to obtain a plurality of frequency correlations; and
    K. plotting said frequency correlations on a two-dimensional graph.

16. A method for performing a solid-state, two-dimensional heteronuclear correlation NMR experiment according to claim 11 wherein step C further comprises the step of:
    C1. irradiating said second nuclear species with at least one radio-frequency pulse sequence which is a cyclic permutation of the radio-frequency pulse sequence:

−X, Y, −X, X, Y, −X, −X, Y, X, −X, Y, −X.

17. A method for performing a solid-state, two-dimensional heteronuclear correlation NMR experiment according to claim 11 wherein step C further comprises the step of:
    C2. Irradiating said second nuclear species with at least one radio-frequency pulse sequence which is a rotation of the radio-frequency pulse sequence:

−X, Y, −X, X, Y, −X, −X, Y, X, −X, Y, −X.

18. A method for performing a solid-state, two-dimensional heteronuclear correlation NMR experiment according to claim 11 wherein step C further comprises the step of:
    C3. irradiating said second nuclear species with at least one radio-frequency pulse sequence which is a reflection of the radio-frequency pulse sequence:

−X, Y, −X, X, Y, −X, −X, Y, X, −X, Y, −X.

19. A method for performing a solid-state, two-dimensional heteronuclear correlation NMR experiment involving a first nuclear species and a second nuclear species comprising the steps of:
    A. exciting said first nuclear species with at least one radio-frequency preparation pulse during a preparation period;
    B. irradiating said first nuclear species with a BLEW-12 radio-frequency pulse sequence during an evolution period subsequent to said preparation period;

C. irradiating said second nuclear species during said evolution period with at least one radio-frequency pulse sequence composed of twelve 90° radio-frequency pulses having the relative phases:

−X, Y, −X, X, Y, −X, −X, Y, X, −X, Y, −X, X,
−Y, X, −X, −Y, X, X, −Y, −X, X, −Y, X, where the phase of an X pulse differs from the phase of a Y pulse by 90° and the phase of an X pulse differs from the phase of a −X pulse by 180°;

D. irradiating said first and said second nuclear species during a mixing period subsequent to said evolution period with a radio-frequency pulse sequence which suppresses homonuclear coupling between nuclei of said first species and nuclei of said second species;

E. irradiating said first nuclear species with continuous-wave radio-frequency energy during a detection period following said mixing period; and F. detecting the transverse magnetization of said second nuclear species during said detection period.

20. A method for performing a solid-state, two-dimensional heteronuclear correlation NMR experiment according to claim 19 wherein step D comprises the step of:

D1. irradiating said first and said second nuclear species during said mixing period with a WIM-24 radio-frequency pulse sequence.

21. A method for performing a solid-state, two-dimensional heteronuclear correlation NMR experiment according to claim 19 wherein step D comprises the step of:

D2. irradiating said first nuclear species during said mixing period with phase-switched and frequency-switched Lee-Goldberg radio-frequency signals; and D3. irradiating said second nuclear species during said mixing period with phase-switched radio-frequency signals simultaneously with step D2.

22. A method for performing a solid-state, two-dimensional heteronuclear correlation NMR experiment according to claim 19 wherein step A comprises the step of:

A1. irradiating said first nuclear species with a single 90° radio-frequency pulse during said preparation period.

23. A method for performing a solid-state, two-dimensional heteronuclear correlation NMR experiment according to claim 19 wherein said evolution period has a predetermined duration and said method further comprising the steps of:

G. incrementing said evolution period duration a predetermined amount;

H. repeating steps A–F;

I. repeating steps G and H a predetermined number of times to acquire a plurality of data points;

J. performing a Fourier transformation in two dimensions on said data points to obtain a plurality of frequency correlations; and K. plotting said frequency correlations on a two-dimensional graph.

24. A method for performing a solid-state, two-dimensional heteronuclear correlation NMR experiment according to claim 19 wherein step C further comprises the step of:

C1. irradiating said second nuclear species with at least one radio-frequency pulse sequence which is a cyclic permutation of the radio-frequency pulse sequence:

−X, Y, −X, X, Y, −X, −X, Y, X, −X, Y, −X, X,
−Y, X, −X, −Y, X, X, −Y, −X, X, −Y, X.

25. A method for performing a solid-state, two-dimensional heteronuclear correlation NMR experiment according to claim 19 wherein step C further comprises the step of:

C2. irradiating said second nuclear species with at least one radio-frequency pulse sequence which is a rotation of the radio-frequency pulse sequence:

−X, Y, −X, X, Y, −X, −X, Y, X, −X, Y, −X, X,
−Y, X, −X, −Y, X, X, −Y, −X, X, −Y, X.

26. A method for performing a solid-state, two-dimensional heteronuclear correlation NMR experiment according to claim 19 wherein step C further comprises the step of:

C3. irradiating said second nuclear species with at least one radio-frequency pulse sequence which is a reflection of the radio-frequency pulse sequence:

−X, Y, −X, X, Y, −X, −X, Y, X, −X, Y, −X, X,
−Y, X, −X, −Y, X, X, −Y, −X, X, −Y, X.

* * * * *